US008026774B2

(12) United States Patent
Yagisawa et al.

(10) Patent No.: US 8,026,774 B2

(45) Date of Patent: Sep. 27, 2011

(54) RADIO FREQUENCY SIGNAL TRANSMISSION METHOD WITH COAXIAL CONNECTION HAVING A DIELECTRIC MATERIAL FOR IMPEDANCE MATCHING

(75) Inventors: Takatoshi Yagisawa, Kawasaki (JP); Keiichi Ishikawa, Setagaya (JP); Yushi Kirii, Setagaya (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 12/929,826

(22) Filed: Feb. 17, 2011

(65) Prior Publication Data

US 2011/0140800 A1 Jun. 16, 2011

Related U.S. Application Data

(63) Continuation of application No. 12/285,802, filed on Oct. 14, 2008, now Pat. No. 7,952,449.

(30) Foreign Application Priority Data

Jul. 11, 2008 (JP) ................................ 2008-181883

(51) Int. Cl.
*H03H 7/38* (2006.01)
*H01P 1/00* (2006.01)

(52) U.S. Cl. ......................................... 333/33; 333/244

(58) Field of Classification Search .................... 333/33, 333/185, 243, 244, 245, 236; 439/578
See application file for complete search history.

(56) References Cited

U.S. PATENT DOCUMENTS

| | | | | |
|---|---|---|---|---|
| 2,774,944 | A | 12/1956 | Lintzel | 333/244 |
| 3,602,848 | A | 8/1971 | Leonard | 333/206 |
| 3,760,306 | A | 9/1973 | Spinner et al. | 333/245 |
| 4,409,637 | A | 10/1983 | Block | 361/119 |
| 5,576,675 | A | 11/1996 | Oldfield | |
| 6,496,353 | B1 | 12/2002 | Chio | |
| 7,180,392 | B2 | 2/2007 | Grothen et al. | |

OTHER PUBLICATIONS

U.S. military standard MIL_STD_348A, Notice 5, Nov. 18, 2002.
U.S. Appl. No. 12/285,802, filed Oct. 14, 2008, Takatoshi Yagisawa et al., Fujitsu Limited.
Restriction Requirement mailed from the Unites States Patent and Trademark Office on Aug. 5, 2010 in the related U.S. Appl. No. 12/285,802.
Notice of Allowance mailed from the Unites States Patent and Trademark Office on Nov. 19, 2010 in the related U.S. Appl. No. 12/285,802.

*Primary Examiner* — Stephen Jones
(74) *Attorney, Agent, or Firm* — Staas & Halsey LLP

(57) ABSTRACT

A radio frequency signal transmission method for transmitting a radio frequency signal through an inner conductor serving as a signal line, the radio frequency signal transmission method including: causing the radio frequency signal to be input to and propagate through the inner conductor, an impedance between the inner conductor and an outer conductor serving as a grounding line being adjusted to a predetermined impedance; and causing a component of the radio frequency signal to propagate through a capacitor provided in a middle of the inner conductor, an impedance at a portion of the capacitor installed being adjusted to match the predetermined impedance by a dielectric material provided around the capacitor.

4 Claims, 13 Drawing Sheets

(a)
2C
2A
4B
6
22
(b)
4B
10
2C
10
2A
10
10
(c)
4A
4B
10
2C
10
10
10

(d)
20C
10
10
4
4A
4B
2A
2B
3
10
6
22
3
10

32
32a
30a
30

32
30

RADIO FREQUENCY SIGNAL TRANSMISSION METHOD WITH COAXIAL CONNECTION HAVING A DIELECTRIC MATERIAL FOR IMPEDANCE MATCHING

CROSS-REFERENCE TO RELATED APPLICATIONS

This application is a continuation of and claims priority benefit to U.S. patent application Ser. No. 12/285,802, filed Oct. 14, 2008 now U.S. Pat. No. 7,952,449, which application in turn is based upon and claims the benefit of priority from prior Japanese Patent Application No. 2008-0181883, filed Jul. 11, 2008, the entire contents of which are incorporated herein by reference.

BACKGROUND

1. Field

The embodiment discussed herein is directed to a coaxial connector for transmitting an electric signal.

2. Description of the Related Art

Generally, a coaxial connector is used to connect signal lines for transmitting a high-speed (radio frequency) electric signal. An inner conductor serving as a signal line is provided in a central part of a coaxial connector, and an outer conductor serving as a grounding line is provided to surround the inner conductor. A dielectric material is filled between the inner conductor and the outer conductor. An outer diameter of the inner conductor and an inner diameter of the outer conductor are set to predetermined diameters so as to match a specific impedance (for example, 50Ω).

In the above-mentioned coaxial connector, there is a cutoff frequency fc at which a signal having a frequency higher than a fixed frequency cannot be transmitted. The cutoff frequency fc is determined by the outer diameter of the inner conductor, the inner diameter of the outer conductor, and a specific dielectric constant of the dielectric material filled between the inner conductor and the outer conductor. The cutoff frequency fc becomes higher as the diameters become smaller and the specific dielectric constant becomes lower. Accordingly, in order to transmit a radio frequency signal, it is necessary to make the diameter of the coaxial connector small and make the specific dielectric constant of the filled dielectric material low. Generally, in order to obtain a radio frequency transmission band of about more than 60 GHz, the outer diameter of the inner conductor is reduced to about 1 mm and an air ($\epsilon r=1.0$) is used as a dielectric material.

In recent years, miniaturization and speeding up have progressed in measuring instruments and optical transmission and reception devices that handle a high-speed (radio frequency) electric signal. With such a progress, there is a demand for miniaturizing coaxial connectors used for those devices are required. Although connectors having a screw-type connecting part, which are represented by a 2.92 mm connector or a 1.85 mm connector, were in popular use, connectors having a push-on type connecting part, such as an SMP connector or an SMPM connector, have become popular with the demand for miniaturization (for example, refer to Non-Patent Document 1).

In many cases, a coaxial connector used for connection between measuring instrument or devices is provided with functions such as a DC block or a frequency filter. The DC block is provided for interrupting a direct current component and to transmit only an alternating current (AC) signal. The frequency filter is provided for attenuating a specific frequency component of a signal.

Specifically, the DC block and the frequency filter are formed by inserting a capacitor in the middle of the inner conductor. For example, it is suggested to divide the inner conductor into a first inner conductor and a second inner conductor and connecting the first and second inner conductors with two flat-plate capacitors located therebetween in series (for example, refer to Patent Document 1). Additionally, it is suggested to divide the inner conductor into a first inner conductor and a second inner conductor while forming surfaces parallel to the axis and connecting the first and second inner conductors with a dielectric material located therebetween (for example, refer to Patent Document 2).

According to the structures of the DC blocks, a strength of a connecting part (a part where the DC block is formed) between the first inner conductor and the second inner conductor is small, and the connecting part may be damaged due to a thermal stress of the inner conductor or the like. Thus, it is suggested to provide a stress relaxation mechanism for absorbing and relaxing a stress in the axial direction (for example, refer to Patent Document 3)

Patent Document 1: U.S. Pat. No. 6,496,353
Patent Document 2: U.S. Pat. No. 7,180,392
Patent Document 3: U.S. Pat. No. 5,576,675
Non-Patent Document 1: U.S. military standard MIL_STD_348A If a capacitor is interposed in the middle of the inner conductor as mentioned above, it is difficult to equalize an impedance between the capacitor and the outer conductor and an impedance between the inner conductor and the outer conductor. That is, a distance between the inner conductor and the outer conductor, which is set to maintain a predetermined impedance, is changed at the portion of the capacitor, which results in a change in the impedance. Accordingly, an impedance mismatch occurs at the portion where the capacitor is provided, which causes degradation of a radio frequency signal transmission characteristic.

Accordingly, it is desirous to develop a small coaxial connector having a structure in which, even if a capacitor is inserted in a middle of an inner conductor, an impedance mismatch at a portion where the capacitor is provided is suppressed.

SUMMARY

There is provided a coaxial connector comprising: a first inner conductor and a second inner conductor; a capacitor connecting between the first inner conductor and the second inner conductor; an outer conductor extending along and surrounding the first inner conductor, the second inner conductor, and the capacitor; a first dielectric material filled in a gap between the outer conductor and the first and second inner conductors; a support member supporting the first and second inner conductors with respect to the outer conductor; and a second dielectric material for impedance matching provided between the capacitor and the outer conductor.

There is provided a radio frequency signal transmission method for transmitting a radio frequency signal through an inner conductor serving as a signal line, the radio frequency signal transmission method comprising: causing the radio frequency signal to be input to and propagate through the inner conductor, an impedance between the inner conductor and an outer conductor serving as a grounding line being adjusted to a predetermined impedance; and causing a component of the radio frequency signal to propagate through a capacitor provided in a middle of the inner conductor, an impedance at a portion of the capacitor installed being adjusted to match said predetermined impedance by a dielectric material provided around said capacitor.

Additional objects and advantages of the embodiment will be set forth in part in the description which follows, and in part will be obvious from the description, or may be learned by practice of the invention. The object and advantages of the embodiment will be realized and attained by means of the elements and combinations particularly pointed out in the appended claims.

It is to be understood that both the foregoing general description and the following detailed description are exemplary explanatory only and are not restrictive of the invention, as claimed.

DESCRIPTION OF EMBODIMENTS

Figure 1:
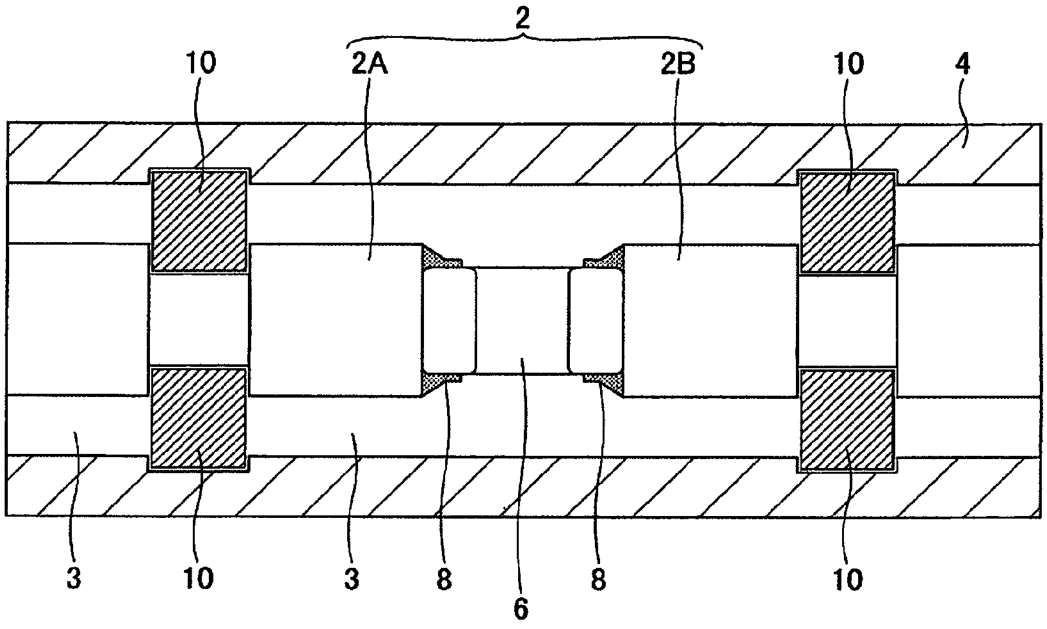
FIG. 1 is a cross-sectional view of a coaxial connector having a basic structure.

Preferred embodiments of the present invention will be explained with reference to the accompanying drawings.

A description will now be given, with reference to FIG. 1, of a basic structure of a coaxial connector. The coaxial connector illustrated in FIG. 1 includes an inner conductor 2, an outer conductor 4 surrounding the inner conductor 2 and a dielectric material 3 as a first dielectric material filled in a gap between the inner conductor 2 and the outer conductor 4. The inner conductor 2 and the outer conductor 4 are formed of an electrically conductive metal such as a copper alloy. A predetermined gap is formed between the inner conductor 2 and the outer conductor 4. It is preferable that a material having a small specific dielectric constant $\epsilon r$ is filled in the gap. In many cases, a fluorocarbon resin is used as the material having a small specific dielectric constant $\epsilon r$ to be filled in the gap. However, the gap may be an air gap. In such a case, an air in the gap corresponds to the material filled in the gap. Here, it is assumed that an air is filled in the gap between the inner conductor 2 and the outer conductor 4, and an air is filled in the gap as the dielectric material 3.

The inner conductor 2 is divided into two portions, i.e., an inner conductor 2A and an inner conductor 2B, and a capacitor 6 is inserted between the inner conductor 2A and the inner conductor 2B. The capacitor 6 is connected and fixed to the inner conductor 2A and the inner conductor 2B by a joining material such as a solder 8. Although a laminated ceramic chip capacitor, which is formed as a mount part to be mounted to a generally used substrate, is used as the capacitor 6, the capacitor 6 is not limited to such a chip capacitor. It should be noted that, in the example illustrated in FIG. 1, the inner conductors 2A and 2B are mechanically connected to each other by joining and fixing them with the capacitor 6 interposed therebetween. Thus, a connecting strength of the inner conductors 2A and 2B is equal to a connecting strength of the solder 8.

The inner conductor 2 into which the capacitor 6 is incorporated is fixed to the outer conductor 4 via a support member 10. It is preferable to use a resin as a material to form the support member 10. Since a specific dielectric constant $\epsilon r$ of a resin is generally 2 to 4 ($\epsilon r$=2 to 4), the specific dielectric constant $\epsilon r$ of the portion where the support member 10 is provided is larger than that of portions (air gap) other than the portion where the support member 10 is provided. Thus, impedance matching is achieved by enlarging the gap by providing grooves to the inner conductor 2 and the outer conductor 4 where the support member 10 is provided. It should be noted that the grooves serve as engaging portions for attaching the support member 10 to the inner conductor 2 and the outer conductor 4.

Figure 2:
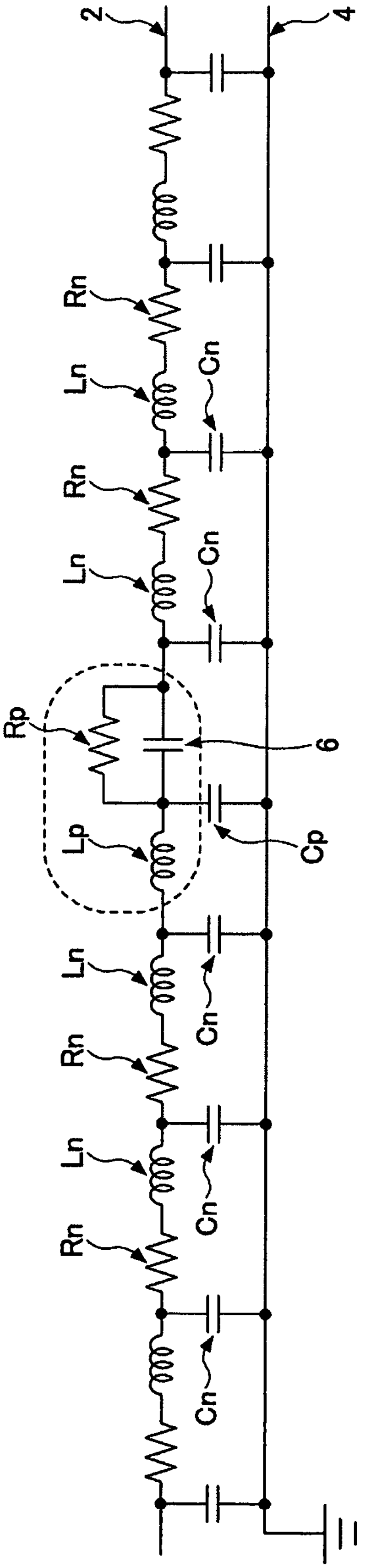
FIG. 2 is a circuit diagram of an equivalent circuit of a transmission path of the coaxial connector illustrated in FIG. 1.

A circuit illustrated in FIG. 2 is an equivalent circuit of a signal transmission path in the structure of the coaxial connector illustrated in FIG. 1. Because outer diameters of internal electrodes of the capacitor 6 are smaller than an outer diameter of the inner conductor 2, a width of the gap between the capacitor 6 and the outer conductor 4 is larger than a width of a gap in other portions. Thus, a parasitic capacitance (a capacitor Cp of FIG. 2) generated by the capacitor 6 being provided is smaller than an electrostatic capacitance (a capacitor Cn of FIG. 2) generated between the inner conductor 2 and the outer conductor 4.

Here, on the assumption that the equivalent circuit illustrated in FIG. 2 is a single distribution constant circuit, an impedance Z thereof is represented by $Z=(L/C)^{1/2}$ where L is an inductance per unit length and C is a capacitance per unit length. According to the equation, the inductance dependency is large, that is, it is regarded that an inductance Lp is increased as a capacitance Cp is decreased, and, thus, the impedance Z is increased. That is, the impedance in the portion where the capacitor 6 is provided is larger than impedances of other portions, which causes generation of an impedance mismatch.

If an impedance mismatch occurs as mentioned above, a reflection of a radio frequency signal occurs in that portion, which results in a degradation of a radio frequency signal transmission characteristic. Thus, the impedance of the portion where the capacitor 6 is provided is matched by adjusting the parasitic capacitance Cp of the capacitor 6 so as to improve the radio frequency signal transmission characteristic.

Figure 3:
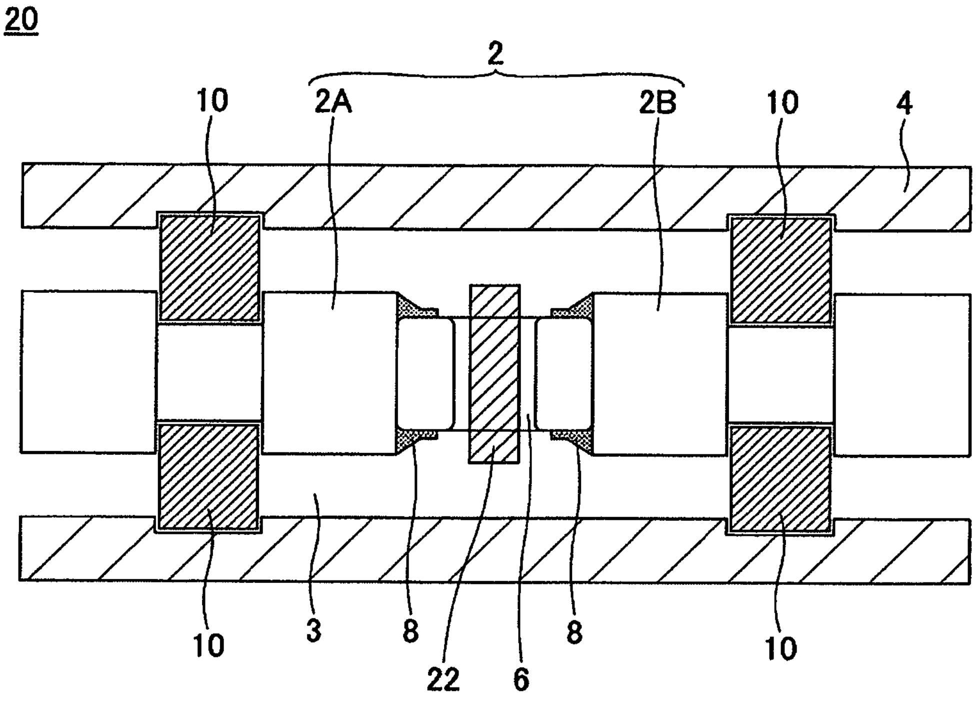
FIG. 3 is a cross-sectional view of a coaxial connector according to a first embodiment.

FIG. 3 is a cross-sectional view of a coaxial connector according to a first embodiment. A basic structure of the coaxial connector 20 illustrated in FIG. 3 is the same as that of the coaxial connector illustrated in FIG. 1, and parts that are the same as the parts illustrated in FIG. 1 are given the same reference numerals and descriptions thereof will be omitted.

In FIG. 3, a dielectric material ring 22 as a second dielectric material is attached to an outer circumference of the capacitor 6. The dielectric material ring 22 serves as a material for matching the parasitic capacitance Cp of the capacitor 6. The dielectric material ring 22 can be formed of any material having an insulation property and a specific dielectric constant larger than the specific dielectric constant of the dielectric material 3 (in this case, larger than the specific dielectric material $\epsilon r=1$ of air). For example, the dielectric material ring 22 may be formed of the same fluorocarbon resin as the support member 10 or a rubber such as a fluorocarbon rubber. Although the dielectric material ring 22 is described as a ring, the same effect can be obtained if it is a semi-circular shape or a shape to be applied partially around the capacitor 6.

By arranging the dielectric material ring 22 around the capacitor 6, the parasitism capacitance Cp generated between the capacitor 6 and the outer conductor 4 can be increased. Therefore, the impedance matching can be achieved in the portion where the capacitor 6 is provided. That is, the impedance can be constant (for example, a specific impedance of 50Ω) also in the portion where the capacitor 6 is provided by arranging the dielectric material ring 22 having a large specific dielectric constant $\epsilon r$ around the capacitor 6, thereby suppressing reflection of a radio frequency signal. As a result, even if the capacitor 6 is provided in the middle of the inner conductor 2, reflection of a radio frequency due to an impedance change can be reduced, and the radio frequency signal transmission characteristic of the coaxial connector 20 can be maintained well.

Figure 4:
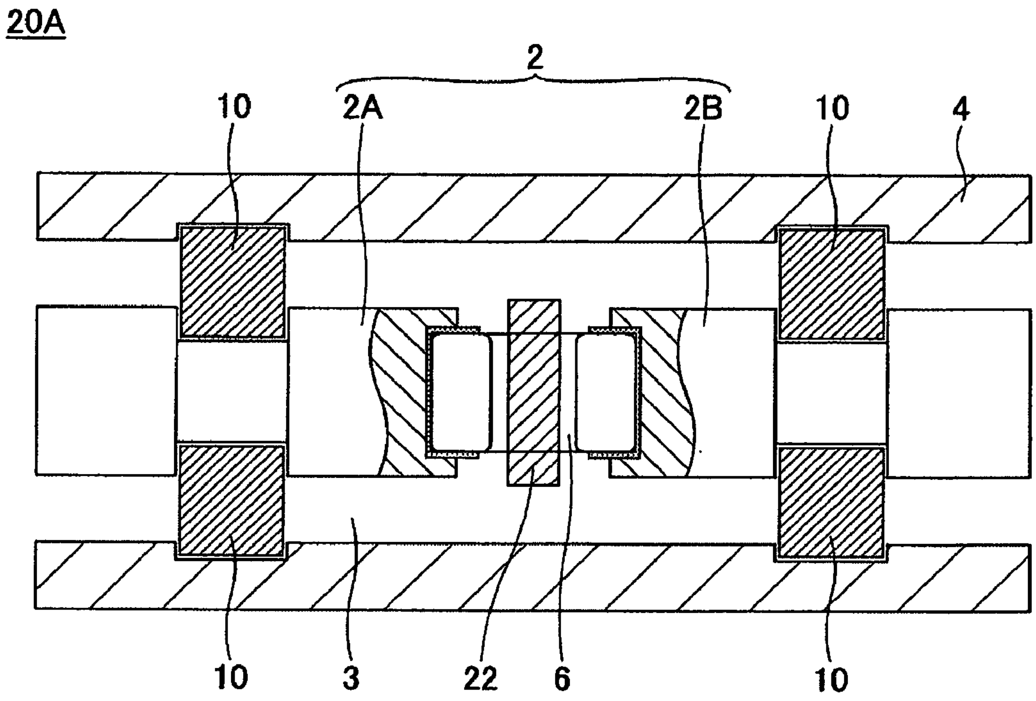
FIG. 4 is a cross-sectional view of a first variation of the coaxial connector illustrated in FIG. 3.

It should be noted that, like a coaxial connector 20A illustrated in FIG. 4, concave portions of a size almost equal to the outer configuration of the capacitor 6 may be formed in the end surfaces of the inner conductors 2A and 2B so that the capacitor 6 is joined to the inner conductors 2A and 2B by a solder or the like after fitting the capacitor 6 in the concave portions. Thereby, strength of the connecting part by the capacitor 6 can be increased. The concave portions may be recesses or notches of a channel shape, or may be formed by members connected to the inner conductors 2A and 2B.

Figure 5:
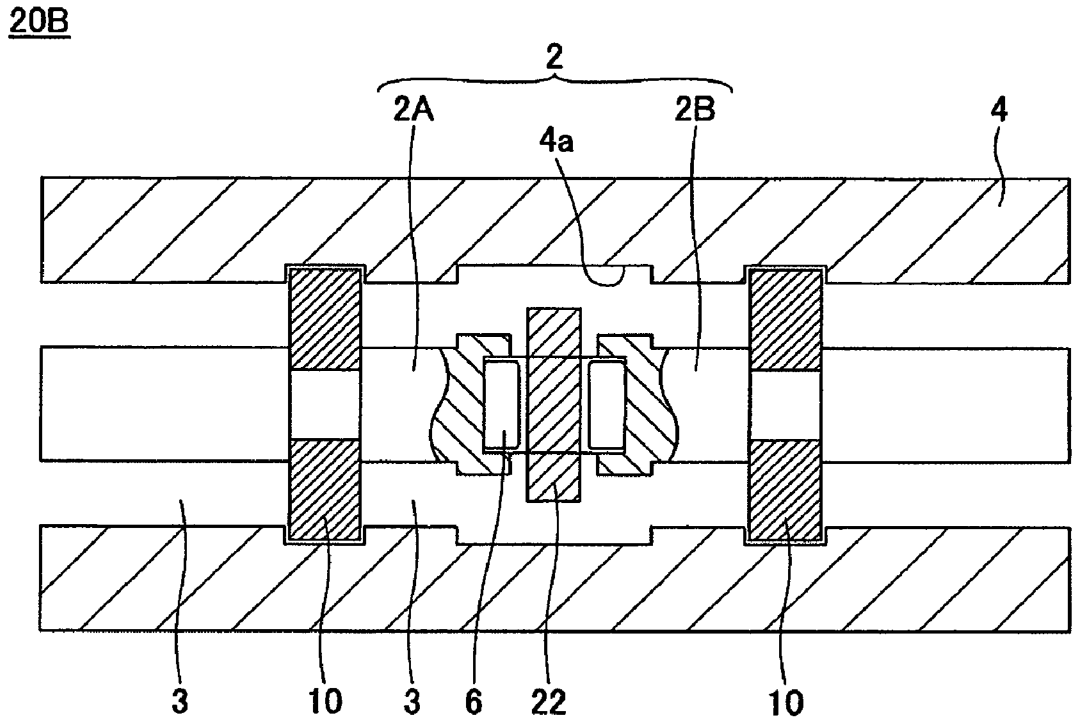
FIG. 5 is a cross-sectional view of a second variation of the coaxial connector illustrated in FIG. 3.

Here, if the outer diameter of the capacitor 6 is close to or larger than the outer diameter of the inner conductors 2A and 2B and the end surfaces of the inner conductors 2A and 2B do not have a sufficient size to form the concave portions, the outer diameter of the inner conductors 2A and 2B may be increased so as to form the large diameter portions like a coaxial connector illustrated in FIG. 5. In such a case, it is necessary to form concave portion 4*a* on the inner surface of the outer conductor 4 at a position facing the large diameter portions having a large diameter near the end surfaces of the inner conductors 2A and 2B. That is, it is necessary to set the impedance to a desirable value by a distance between the outer conductor 4 and each of the inner conductors 2A and 2B even in the portions having the large diameter near the end surfaces of the inner conductors 2A and 2B.

Figure 6:
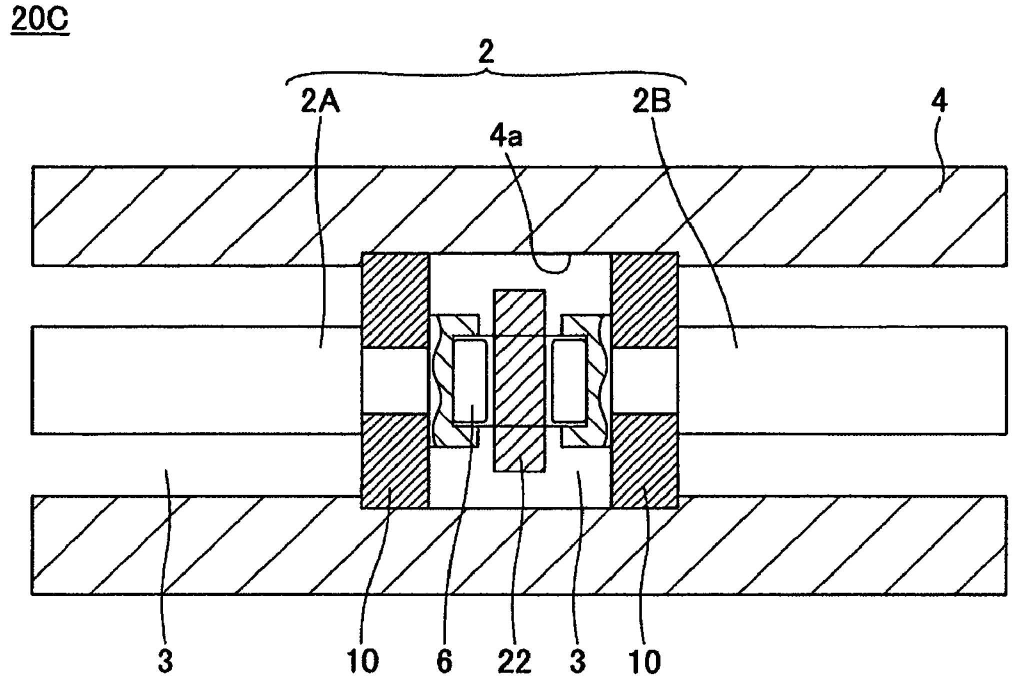
FIG. 6 is a cross-sectional view of a third variation of the coaxial connector illustrated in FIG. 3.

Further, like a coaxial connector 20C illustrated in FIG. 6, grooves formed in the inner surface of the outer conductor 4 into which the support members 10 are fit and the above-mentioned concave portion 4*a* for impedance matching may be formed as a single groove or concave portion by shifting the support members 10 toward the connecting part of the capacitor 6. Thereby, the portion where the capacitor 6 is provided can be made small, which permits the entire coaxial connector 20C to be made small. Additionally, since the configuration of the inner surface of the outer conductor 4 can be simplified, cutting work of the outer conductor 4 can be performed easily.

A description will now be given, with reference to FIG. 7, of an example of an assembling method of the coaxial connector 20C illustrated in FIG. 6. According to the assembling method indicated in FIG. 7, the outer conductor 4 is divided into two pieces, outer conductors 4A and 4B, so that the outer conductors 4A and 4B are fit to each other to be a single piece forming the outer conductor 4. Although a description will be given of a fitting method of the outer conductors 4A and 4B using press-fitting here, the assembling method is not limited to the press-fitting and may include fitting by screw and electrical or physical connection.

Figure 7:
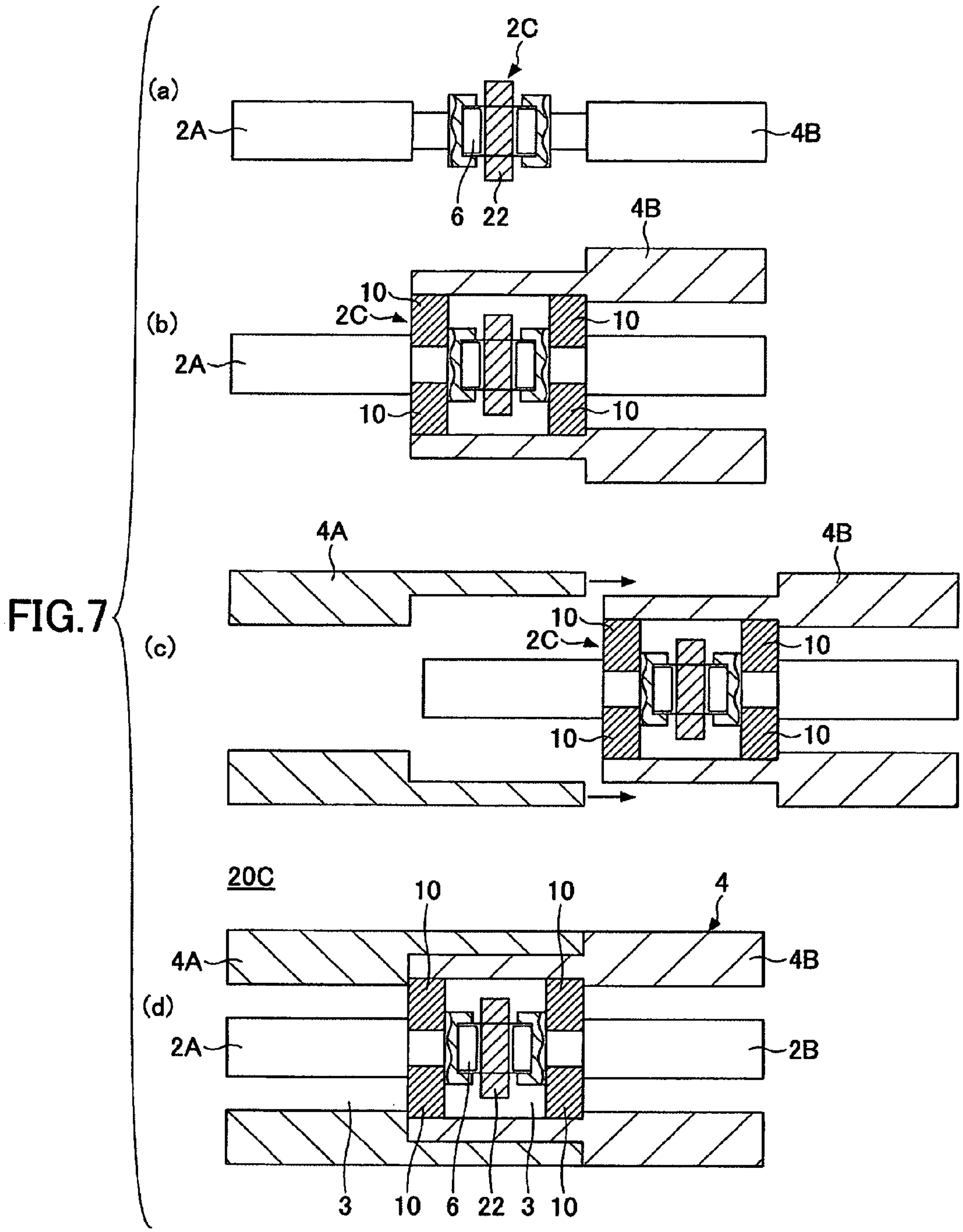
FIG. 7 is an illustration indicating a manufacturing method of the coaxial connector illustrated in FIG. 6.

First, as illustrated in FIG. 7-(*a*), the capacitor 6 on which the dielectric material ring 22 is fit is inserted into the concave portions of the end surfaces of the inner conductors 2A and 2B, and fixed by solder or the like so as to form an inner conductor assembly 2C. Then, the support members 10 are attached to the inner conductors 2A and 2B of the inner conductor assembly 2C, respectively. Thereafter, as illustrated in FIG. 7-(*b*), the inner conductor assembly 2C is assembled to the outer conductor 4B so that the support member 10 fits in the concave portion 4*a* of the outer conductor 4B. Then, as illustrated in FIG. 7-(*c*), the outer conductor 4A is press-fitted into the outer conductor 4B. Thereby, as illustrated in FIG. 7-(*d*), the outer conductor 4 is formed and the inner conductor assembly 2C is fixed inside the outer conductor 4 in a state where the support members 10 are fixed to the concave portion 4*a* in the inner surface of the outer conductor 4.

As mentioned above, the small-size coaxial connector 20C can be assembled very easily by press-fitting the outer conductor 4A into the outer conductor 4B after inserting the inner conductor assembly 2C into the outer conductor 4B. The assembling method by press-fitting the two-divided outer conductors can be applied to other coaxial connectors mentioned above, and is also applicable to coaxial connectors explained below.

Figure 8:
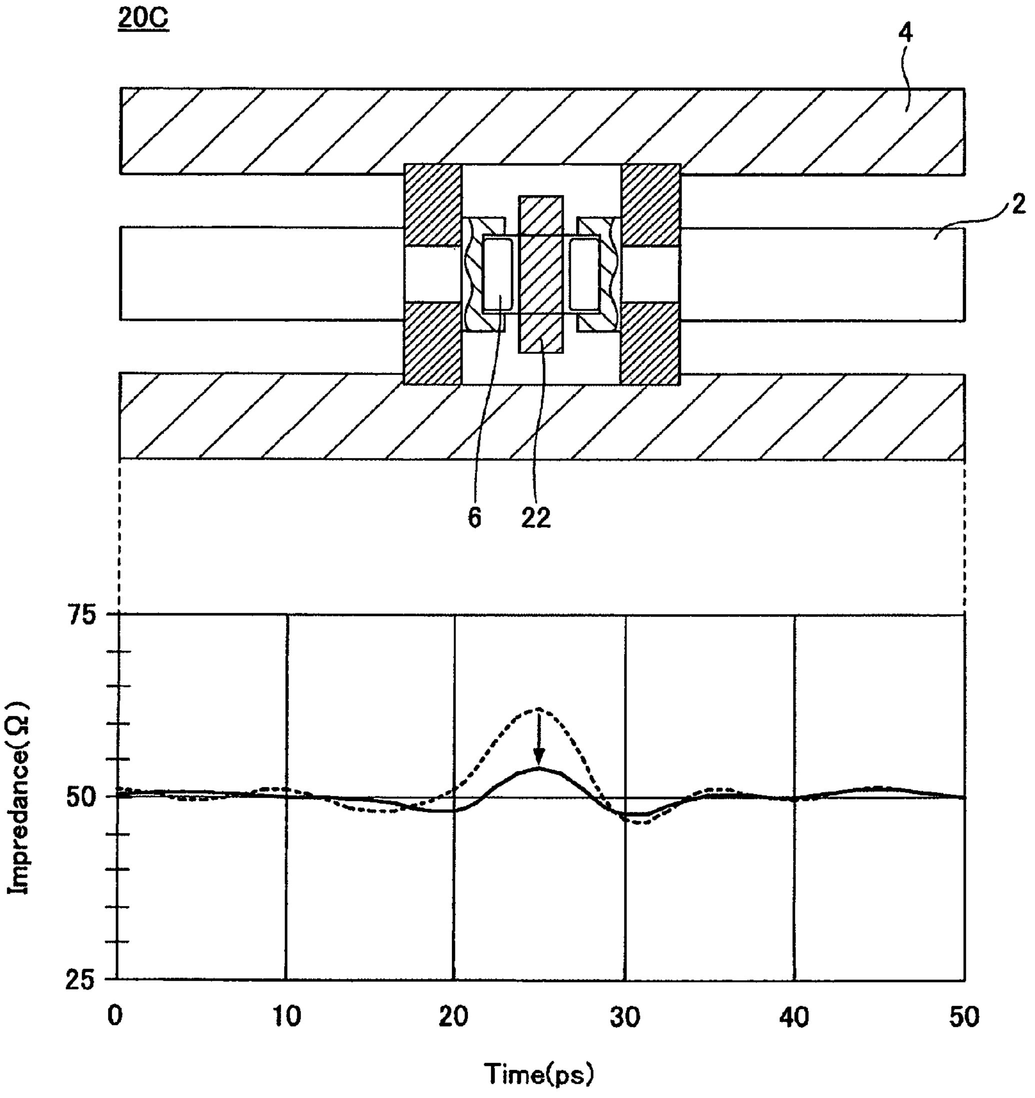
FIG. 8 is a graph indicating the impedance of a coaxial connector acquired by an electromagnetic field simulation.

FIG. 8 is a graph indicating the impedance acquired by an electromagnetic field simulation using the coaxial connector 20C of the structure illustrated in FIG. 6 as a model. In the graph of FIG. 8, a solid line indicates the impedance of the coaxial connector 20C provided with the dielectric material ring 22, and a dashed line indicates the impedance of a coaxial connector, which is not provided with the dielectric material ring 22.

As apparent from the graph of FIG. 8, an impedance change at the portion where the capacitor 6 is provided is suppressed by providing the dielectric material ring 22. That is, by providing the dielectric material ring 22, impedance matching can be achieved and an impedance mismatch can be suppressed.

Figure 9:
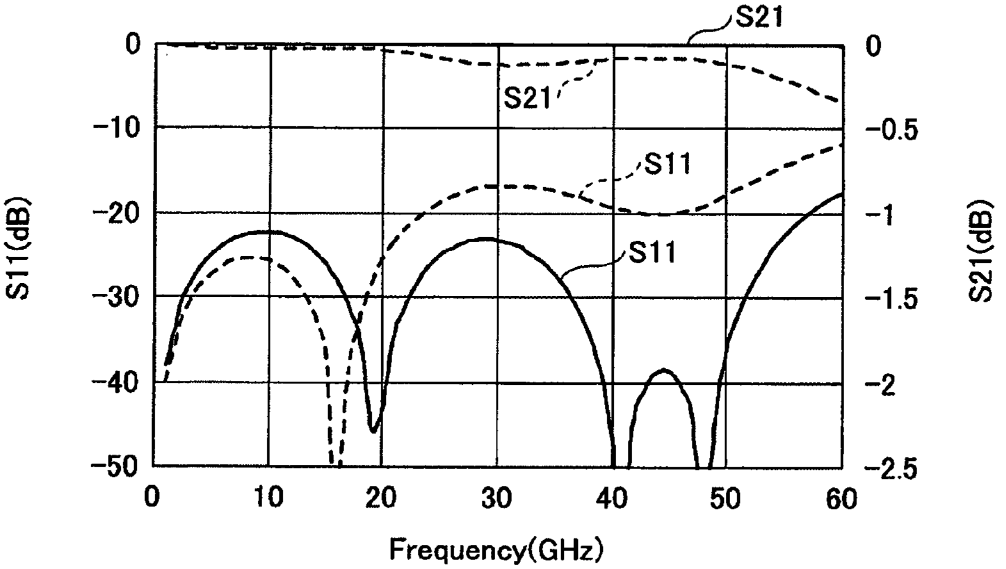
FIG. 9 is a graph indicating a reflection characteristic and a transmission characteristic of a coaxial connector acquired by an electromagnetic field simulation.

FIG. 9 is a graph indicating a reflection characteristic S11 and a transmission characteristic S21 acquired by an electromagnetic filed simulation using the coaxial connector 2C of the structure illustrated in FIG. 6 as a model. In the graph of FIG. 9, solid lines indicate the reflection characteristic S11 and the transmission characteristic S21 of the coaxial connector 20C provided with the dielectric material ring 22, and dashed lines indicate the reflection characteristic S11 and the transmission characteristic S21 of a coaxial connector, which is not provided with the dielectric material ring 22. The two curves (solid line and dashed line) indicated in a lower part of the graph indicate the reflection characteristic S11, and the generally flat two curves (solid line and dashed line) indicated in an upper part of the graph indicate the transmission characteristic S21.

The transmission characteristic S21 of the coaxial connector, which is not provided with the dielectric material ring 22 is indicated by the dashed line, which indicates that the transmission characteristic S21 decreases as the frequency increases. On the other hand, the transmission characteristic S21 of the coaxial connector 20C provided with the dielectric material ring 22 is almost zero over the entire band, which indicates that there is almost no transmission loss. Thus, it can be appreciated that the transmission characteristic S21 in the radio frequency band is improved by providing the dielectric material ring 22.

The reflection characteristic S11 of the coaxial connector, which is not provided with the dielectric material ring 22, indicates that it is below −20 dB in the portion where the frequency is low but reflection increases higher than −20 dB at a frequency exceeding 20 GHz. On the other hand, the reflection characteristic S11 of the coaxial connector 20C provided with the dielectric material ring 22 is below −20 dB in a radio frequency band from a low frequency to about 55 GHz. Thus, it can be appreciated that the reflection characteristic S11 in the radio frequency band is greatly improved by providing the dielectric material ring 22.

Figure 10:
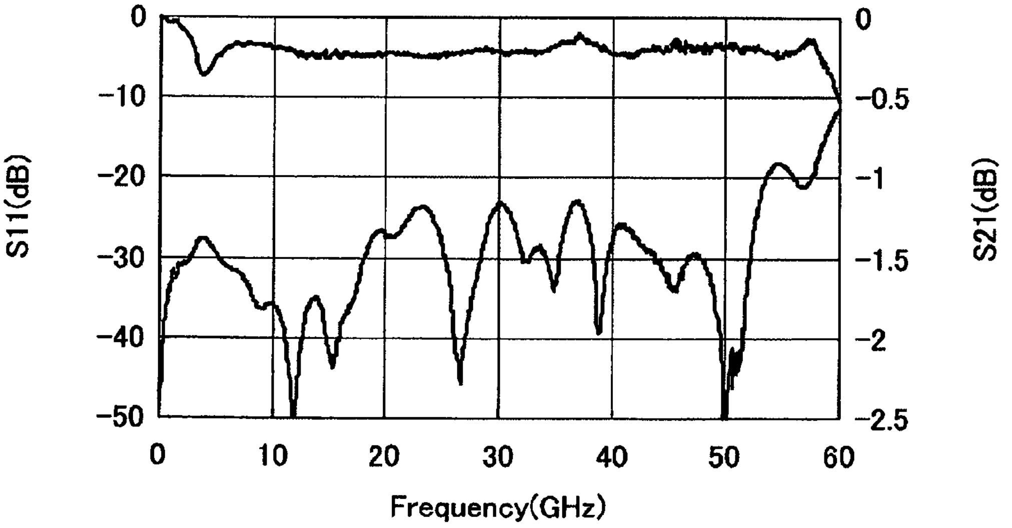
FIG. 10 is a graph indicating actual measurement values of a reflection characteristic and a transmission characteristic of a coaxial connector.

The coaxial connector 20C of the structure illustrated in FIG. 6 was fabricated and the reflection characteristic S11 and the transmission characteristic S21 were measured, and a result indicated in the graph of FIG. 10 was obtained. It can be appreciated from the graph that the reflection characteristic S11 was below −20 dB in a radio frequency band from a low frequency to about 55 GHz, which indicates that the reflection characteristic S11 was greatly improved. On the other hand, since the transmission characteristic S21 was maintained at a value of almost zero to the frequency of about 60 GHz, it was confirmed that a good transmission characteristic was maintained also in a radio frequency band.

Figure 11:
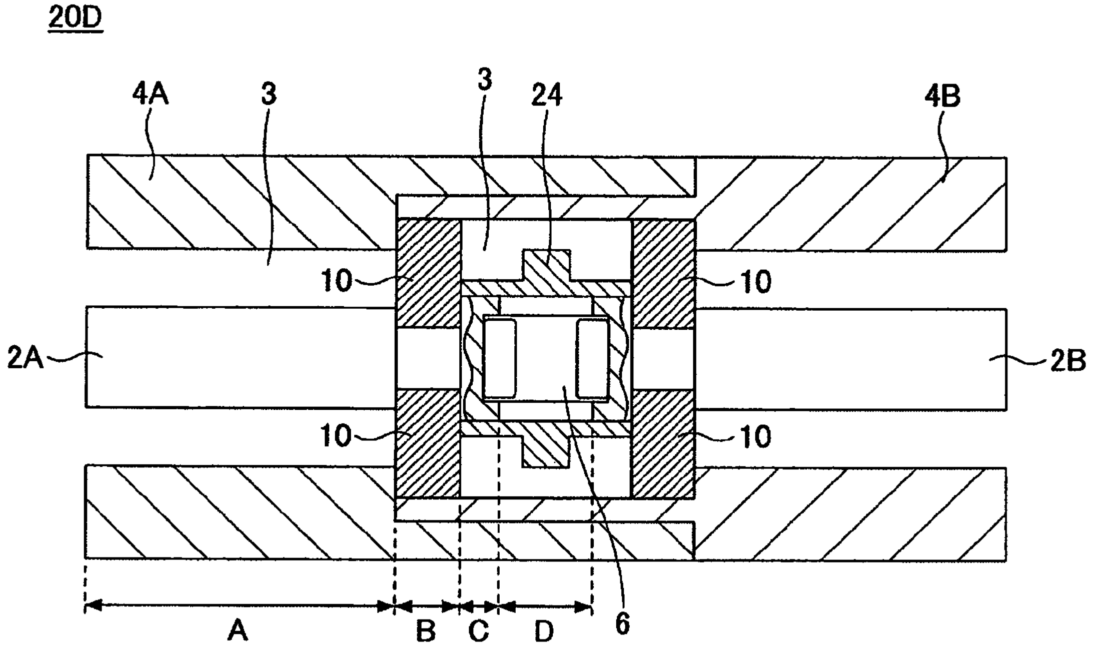
FIG. 11 is a cross-sectional view of a coaxial connector according to a second embodiment.

A description will now be given, with reference to FIG. 11 of a coaxial connector according to a second embodiment. In FIG. 11, parts that are the same as the parts illustrated in FIG. 6 and FIG. 7 are given the same reference numerals, and descriptions thereof will be omitted.

Although the coaxial connector 20D according to the second embodiment has the same structure as the above-mentioned coaxial connector 20C, it differs in that the dielectric material ring 22 is replaced by a modified dielectric material ring 24. The modified dielectric material ring 24 does not have a shape to be attached to an outer circumference of the capacitor 6, but is made in a shape to cover circumferences of the inner conductors 2A and 2B. The length of the modified dielectric material ring 24 is equal to a distance between the support members 10, and opposite ends of the modified dielectric material ring 24 are brought into contact with the respective support members 10.

The thickness of the modified dielectric material ring 24 is set so that impedances between sections B, C and D are equal to the impedance of a section A. Specifically, the thickness of the modified dielectric material ring 24 in the section C is small and the thickness of the modified dielectric material ring 24 in the section D is large so that the portion of the modified dielectric ring 24 in the section D forms a protruding part. Although the protruding part of the modified dielectric material ring 24 protrudes outwardly, it may protrude inwardly so as to maintain a desired thickness. Also the cross-section of the modified dielectric material ring 24 is not always required to be a square shape as illustrated in FIG. 11. The modified dielectric material ring 24 can be various shapes in order to achieve impedance matching.

According to the present embodiment, the modified dielectric material ring 24 is interposed between the support members 10, and the joint part between the inner conductors 2A and 2B can be strengthened by the modified dielectric material ring 24. That is, if a force to compress the capacitor 6 is applied to the inner conductors 2A and 2B when connecting and disconnecting the coaxial connector, a portion of the force can be absorbed by the modified dielectric material ring 24, which can reduce a force applied to the capacitor 6 and the joint part.

Figure 12:
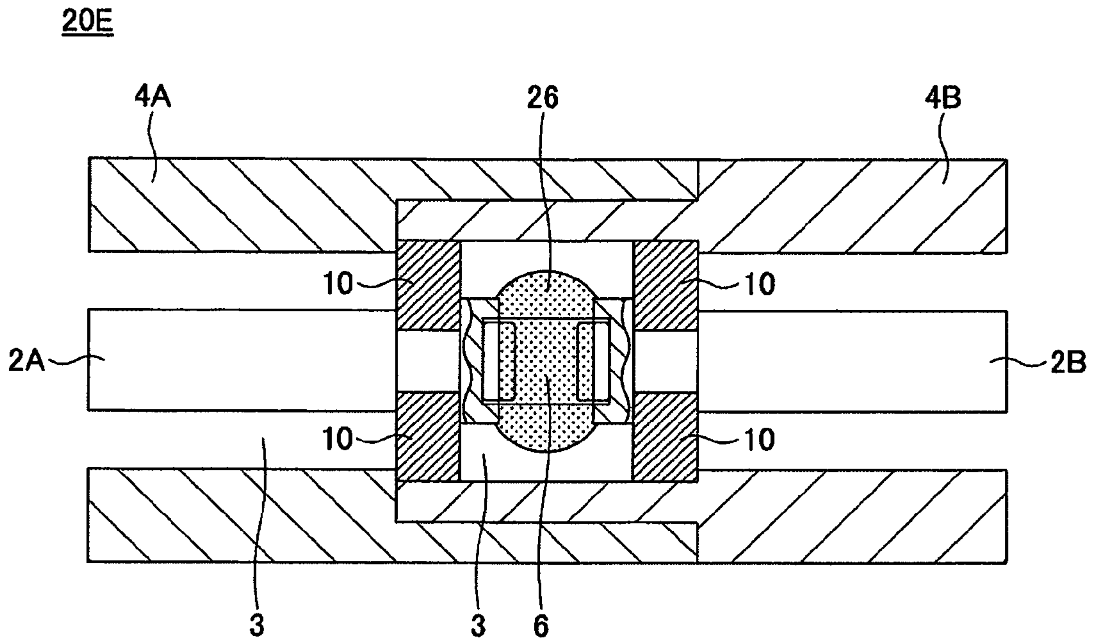
FIG. 12 is a cross-sectional view of a coaxial connector according to a third embodiment.

A description will be given below, with reference to FIG. 12, of a coaxial connector according to a third embodiment. In FIG. 12, parts that are the same as the parts illustrated in FIG. 6 and FIG. 7 are given the same reference numerals, and descriptions thereof will be omitted.

Although the coaxial connector 20E according to the third embodiment has the same structure as the above-mentioned coaxial connector 20C, it differs in that an adhesive 26 is provided to an outer circumference of the capacitor 6 instead of the dielectric material ring 22. By using a resin such as, for example, an epoxy resin as for the adhesive 26, an electrostatic capacitance can be adjusted to achieve the impedance matching as the same as the dielectric material ring 22.

The adhesive 26 may be provided by applying onto the outer circumference of the capacitor 6 and cured, or may be provided on the circumference of the capacitor 6 over an entire area between the inner conductors 2A and 2B. If the adhesive 26 is provided to only the outer circumference of the capacitor 6, the capacitor 6 can be strengthened by the adhesive 26. If the adhesive 26 is provided to cover the outer circumference of the capacitor 6 and the joint part of the capacitor 6, the capacitor 6 is strengthened and also the joint part is strengthened.

Figure 13:
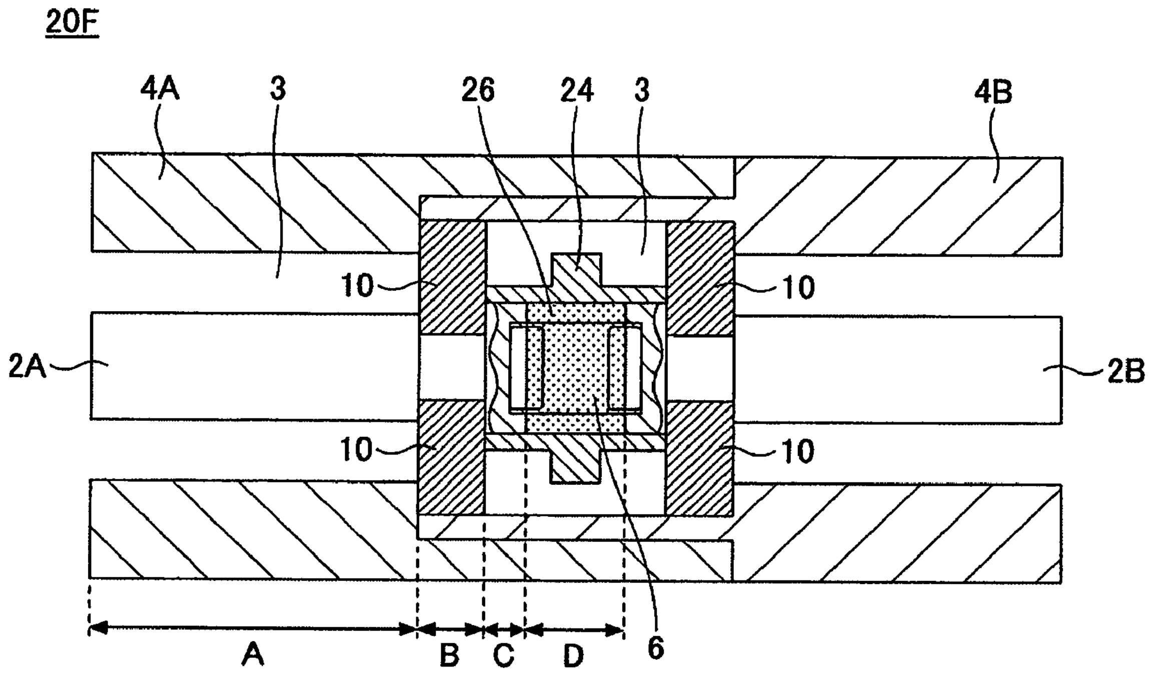
FIG. 13 is a cross-sectional view of a coaxial connector according to a fourth embodiment.

A description will be given below, with reference to FIG. 13, of a coaxial connector according to a fourth embodiment. In FIG. 13, parts that are the same as the parts illustrated in FIG. 11 and FIG. 12 are given the same reference numerals, and descriptions thereof will be omitted.

The coaxial connector 20F according to the fourth embodiment is a combination of the modified dielectric material ring 24 illustrated in FIG. 11 and the adhesive 26 illustrated in FIG. 12. The adhesive 26 is filled in a space between the modified dielectric material ring 24 and the outer circumference of the capacitor 6, and the joint part of the capacitor 6 is strengthened strongly by the modified dielectric material ring 24 and the adhesive 26.

Figures 14A, 14B:
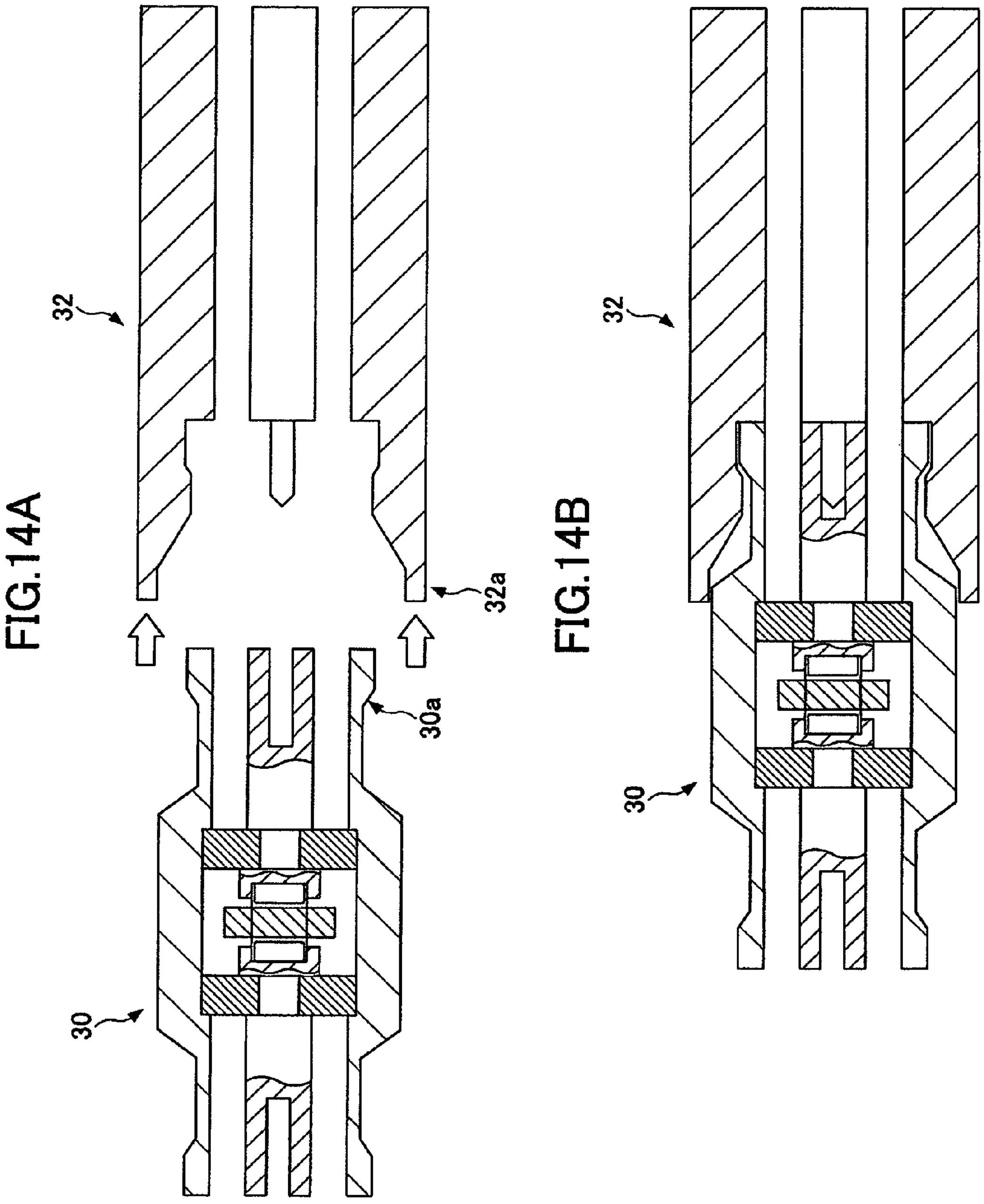
FIG. 14A is a cross-sectional view of a connector when the structure of the coaxial connector illustrated in FIG. 6 is applied to a connector having a fitting part (connecting part) of a push-type in a state before the connector is connected to another connector.
FIG. 14B is a cross-sectional view of the connector shown in FIG. 14A in a state after the connector is connected to another connector.

The structures of the above-mentioned coaxial connectors 20 to 20F can be used for a connector having a fitting part (joint part) of a push-on type such as SMP or SMPM. The specifications of SMP and SMPM are provided in U.S. military standard MIL_STD_348A. FIGS. 14A and 14B are cross-sectional views of a coaxial connector when the structure of the coaxial connector 20C illustrated in FIG. 6 as an example is applied to a connector 30 having a fitting part (joint part) 30*a* of a push-on type. FIG. 14A illustrates a state before the connector 30 is connected to another connector 32. FIG. 14B illustrates a state after the connector 30 is connected to the connector 32.

In FIGS. 14A and 14B, a fitting part (joint part) 30*a* is formed on each of opposite ends of the connector 30 having the structure of the coaxial connector 20C. The fitting part (joint part) 30*a* is configured to be fitted to a fitting part (joint part) 32*a* of the connector 32. The connector 30 can be connected to the connector 32 quickly and easily by placing the fitting part 30*a* of the connector 30 to opposite to the fitting part 32*a* of the connector 32 and pushing the fitting part 30*a* into the fitting part 32*a*.

It should be noted that, by using the above-mentioned coaxial connectors 20 to 20F, a radio frequency signal transmission method to transmit a radio frequency signal while suppressing a signal degradation can be achieved. That is, when transmitting a radio frequency signal through a signal transmission path in which the outer conductor 4 as a grounding line is provided around the inner conductor 2 as a signal line, a method of transmitting a radio frequency signal while maintaining excellent reflection characteristic and transmission characteristic to suppress a signal degradation can be achieved.

In the radio frequency transmission method, first, a radio frequency signal is input to and caused to propagate through the inner conductor 2 as a signal line provided with a predetermined impedance. Then, the radio frequency signal is caused to propagate further through the capacitor 6 inserted in the middle of the inner conductor 2. While the radio frequency signal propagates through the capacitor 6, a component of the radio frequency signal is limited by the capacitor 6. That is, a DC component of the radio frequency signal is removed by the capacitor 6, or only a frequency component of a certain band is removed by the capacitor 6. Because a dielectric material (the dielectric material ring 22, the modified dielectric material ring 24, the adhesive 26) is provided on the outer circumference of the capacitor 6 and the impedance of the portion where the capacitor 6 is provided is matched, a reflection of the radio frequency signal hardly occurs and the radio frequency signal is transmitted without attenuating in the portion where the capacitor 6 is provided.

All examples and conditional language recited herein are intended for pedagogical purposes to aid the reader in understanding the principles of the invention and the concepts contributed by the inventor to furthering the art, and are to be construed a being without limitation to such specifically recited examples and conditions, nor does the organization of such examples in the specification relates to a showing of the superiority and inferiority of the invention. Although the embodiment(s) of the present invention (s) has(have) been described in detail, it should be understood that the various changes, substitutions, and alterations could be made hereto without departing from the spirit and scope of the invention.

What is claimed is:

1. A radio frequency signal transmission method for transmitting a radio frequency signal through an inner conductor serving as a signal line, the radio frequency signal transmission method comprising:

causing the radio frequency signal to be input to and propagate through the inner conductor, an impedance between the inner conductor and an outer conductor serving as a grounding line being adjusted to a predetermined impedance; and causing a component of the radio frequency signal to propagate through a capacitor provided in a middle of said inner conductor, an impedance at a portion of said capacitor installed being adjusted to match said predetermined impedance by a dielectric material provided around said capacitor.

2. The radio frequency signal transmission method according to claim 1, wherein a frequency component of a predetermined band is removed by said capacitor.

3. The radio frequency signal transmission method according to claim 1, wherein a DC component of the radio frequency signal is removed by said capacitor.

4. The radio frequency signal transmission method according to claim 1, wherein a dielectric constant of said dielectric material provided around said capacitor is larger than that between said inner conductor and said outer conductor to match said predetermined impedance.

* * * * *